United States Patent [19]

Mylne, III

[11] Patent Number: 4,725,923
[45] Date of Patent: Feb. 16, 1988

[54] CIRCUITRY PROTECTION APPARATUS
[75] Inventor: John M. Mylne, III, Riverside, Calif.
[73] Assignee: The Toro Company, Riverside, Calif.
[21] Appl. No.: 5,902
[22] Filed: Jan. 22, 1987
[51] Int. Cl.$^4$ .............................................. H05K 1/14
[52] U.S. Cl. ..................................... 361/395; 361/331; 361/399
[58] Field of Search .................. 361/56, 111, 117, 119, 361/331, 380, 392–395, 399

[56] References Cited
U.S. PATENT DOCUMENTS

| 4,071,876 | 1/1978 | Benson et al. | 361/331 |
| 4,420,792 | 12/1983 | Hegner et al. | 361/331 |
| 4,504,883 | 3/1985 | Uchida et al. | 361/331 |

Primary Examiner—A. D. Pellinen
Assistant Examiner—Gregory D. Thompson
Attorney, Agent, or Firm—Poms, Smith, Lande & Rose

[57] ABSTRACT

Apparatus for holding a plurality of circuits and related voltage protection devices in a manner such that: (a) the voltage protection devices are located between the circuitry of a system and the electrical components of the system being operated by such circuitry; (b) the devices may be conveniently replaced; and (c) the devices are electrically connected directly to ground. Thus, the apparatus both protects the circuits from excessively high static voltages encountered by the system in which the circuits are installed and provides a short and direct path to a ground plane.

12 Claims, 3 Drawing Figures

CIRCUITRY PROTECTION APPARATUS

BACKGROUND OF THE INVENTION

1. Field of the Invention

The invention relates to electrical devices; and, more particularly, to a compact device for protecting electric circuits from excessively high static voltages encountered by the system in which the circuits are installed.

2. Description of the Prior Art

Many types of circuits are known in the art. Certain of these circuits are used in environments in which high voltages may be encountered. For example, many circuits are used outdoors such as in electrically operated sprinkler systems. Such systems, such as those in irrigation control systems, are used to control the watering cycles, amount of water delivered, locations, to which the water is delivered, etc. Obviously, the various components of such systems are exposed to the elements and subject to the usual vagaries of nature, such as electrical storms. Sprinkler control wires in such systems are generally buried underground. When lightning strikes such systems, the buried control wires act as antennas which absorb the static electricity produced by the lightning strikes.

There is thus a need for a compact device for diverting excessively high static voltage encountered in a system to electrical ground preventing the excessively high voltages from reaching the circuitry of such system.

SUMMARY OF THE INVENTION

It is an object of this invention to provide improved electrical voltage protection for a circuit.

It is a further object of this invention to carry out the foregoing object using a compact voltage diverting device adapted to be connected in a system between the circuitry of such system and the components being operated by such circuitry.

It is still another object of this invention to provide a high static voltage diverting device for connection in an electrically operated sprinkler system that is exposed to the elements for diverting to ground in a short and direct path excessively high static voltage delivered to the system.

These and other objects are preferably accomplished by providing an apparatus which holds a plurality of circuits and related voltage protection devices in a manner such that: (a) the voltage protection devices are located between the circuitry of a system and the electrical components of the system being operated by such circuitry; (b) the devices may be conveniently replaced; and (c) the devices are electrically connected directly to ground. Thus, the apparatus both protects the circuits from excessively high static voltages encountered by the system in which the circuits are installed and provides a short and direct path to a ground plane.

DESCRIPTION OF THE PREFERRED EMBODIMENT

Figure 1:
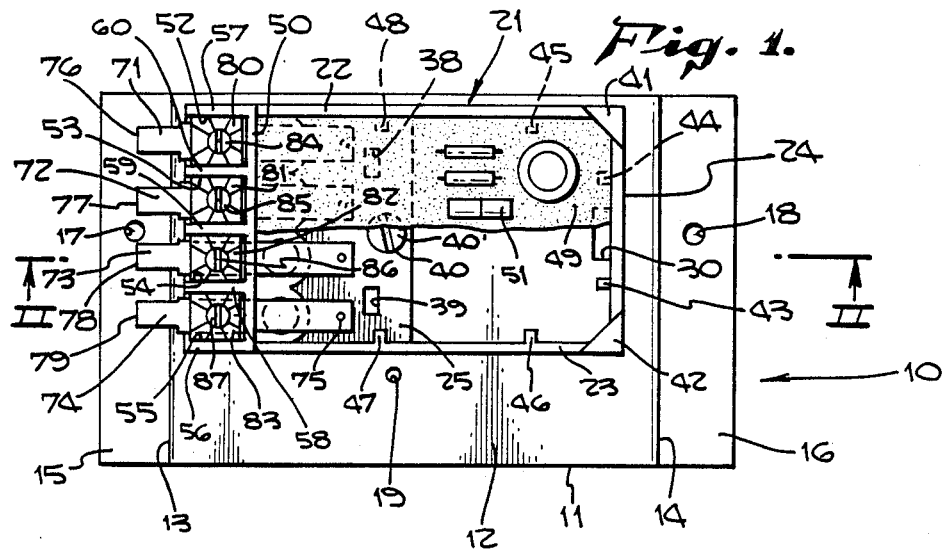
FIG. 1 is a top plan view, partly in section, of a static voltage protecting device for a circuit in accordance with the teachings of the invention.

Referring now to FIG. 1 of the invention, a device 10 is shown for protecting a plurality of circuits from excessively high static voltage encountered by the system in which the circuits are installed. Thus, as seen in FIG. 1, device 10 includes a main housing in the preferred form of a plate of an electrically resilient conductive material, such as stainless steel, aluminum, etc., having an upper planar top member 12 (see also FIG. 2) with spaced downwardly extending side members 13, 14, and planar horizontally extending base support members 15, 16 connected to members 13, 14, respectively.

Members 12 to 16 are preferably integrally connected and may be formed of a unitary piece of material, such as a suitable metallic material. Base support members 15, 16 preferably lie in the same horizontal plane and are preferably parallel to and spaced from the horizontal parallel plane of top member 12.

A plurality of apertures 17 to 20 (see also FIG. 3) may be provided in main housing 11 for securing the same, via screws or the like, to a suitable supporting surface. Thus, apertures 17, 18 are provided in base support members 15, 16 respectively, and apertures 19, 20 are provided in member 12 (see also FIG. 3).

Figure 2:
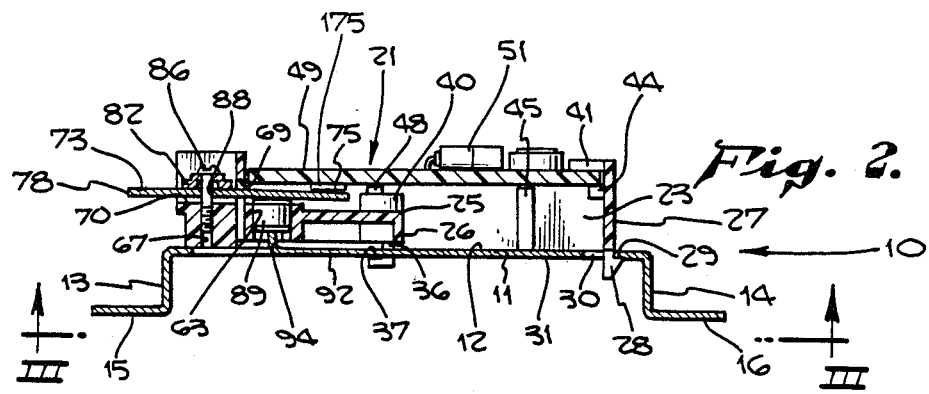
FIG. 2 is a view taken along lines II—II of FIG. 1.

A subhousing 21, of a non-metallic material, such as plastic, is mounted on top of top member 12. Subhousing 21 may be of any suitable configuration but preferably includes a pair of spaced elongated side members 22, 23 interconnected at one end by an end member 24 and at the other end by a planar support member 25. Support member 25 extends between side members 22, 23 as shown and includes a downwardly extending support leg 26, as seen in FIG. 2.

End member 24 may include a locking tab 27, which may be stamped directly out of end member 24, terminating at the bottom in an enlarged insert member 28 (FIGS. 2 and 3) having a shoulder 29. Top member 12 is preferably provided with an opening 30 for receiving the enlarged insert member 28 therein with shoulder 29 abutting against the underside 31 of top member 12 as seen in FIG. 2. Top member 12 may also have one or more other spaced openings, such as openings 32, 33 (See FIG. 3), receiving therein enlarged insert members 34, 35 (FIG. 3) on tabs 36 (only one visible in FIG. 2) extending from support member 25 down through and out of openings 32, 33. These insert members 34, 35 also have shoulders 37 (FIG. 2-only one visible) abutting against the underside 31 of top member 12. Tabs 36 may be of the same material as subhousing 21 and such material is preferably of sufficient resiliency so that all of the tabs 27, 36 snap fit into their respective openings and thus releasably retain subhousing 21 to main housing 11. Areas 38, 39 may be cut out of support member 25 as seen in FIG. 1 to assist in such resilient connection. This allows for quick and easy assembly of parts and easy disengagement of subhousing 21 from main housing 11.

An apertured boss 40 (FIG. 2) is also provided through support member 25 aligned with aperture 20 (FIG. 3) for receiving a screw 40' (FIG. 1) or the like for securing the subhousing 21 and interconnected main housing 11 to a suitable supporting surface.

A pair of triangularly-shaped flanges 41, 42 (see also FIG. 2) are provided at the intersection of members 22, 24 and 23, 24, respectively, at the top thereof. A pair of spaced nubs 43, 44 (FIGS. 1 and 2) are provided on end member 24 extending inwardly thereof and below flanges 41, 42 for reasons to be discussed. A pair of elongated abutment members 45, 46 extend vertically along each side member 22, 23 and terminate at the top at a point lying substantially in the same plane as the upper surface of nubs 43, 44 as seen in FIG. 2.

A pair of nubs 47, 48 are also provided on side members 22, 23 at each side of the support member 25 and terminate at their upper ends at a point also lying in substantially the same plane as the upper surface of nubs 43, 44.

The foregoing nubs 43, 44, 47, 48 and abutment members 45, 46 provide a support surface for a conventional circuit board 49 which is disposed between side members 22, 23, end member 24, and a frontal wall 50, as seen in FIGS. 1 and 2. Board 49 thus has conventional printed circuitry and electronic components 51 thereon and fits under flanges 41, 42 as shown in FIG. 2. Of course, other means may be provided for insertion and retention of board 49 within subhousing 21 and it can be seen that board 49 is electrically insulated from the main housing 11.

As particularly contemplated in the invention, the frontal wall 50 includes a plurality of spaced compartments 52 to 55 being formed by wall extensions leading from frontal wall 50. Thus, end extension 56, 57 are spaced from intermediate wall extensions 58, 59 and 60 to form compartmemts 52 to 55 as seen in FIG. 1.

Figure 3:
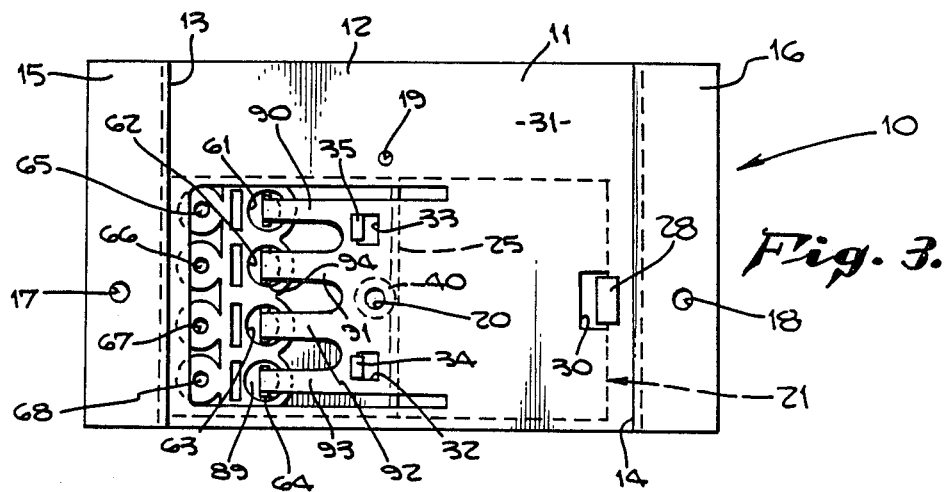
FIG. 3 is a view taken along lines III—III of FIG. 2.

On the other side of frontal wall 50, a plurality, such as four and preferably equal to the number of compartments 52 to 55, of spaced holes 61 to 64 (see FIG. 3) extend linearly along and through support member 25 spaced from wall 50 between side members 22, 23. Each compartment 52 to 55 has an aperture therethrough, such as apertures 65 to 68, and these apertures 65 to 68 may be linearly aligned with the central axis of holes 61 to 64, respectively, as seen in FIG. 3. A plurality of cut-out sections, such as section 69 (FIG. 2), may be provided through wall 50 at the bottom thereof and above the bottom wall 70 of each compartment as seen in FIG. 2, only one such section 69 being visible in the drawing.

All of the foregoing parts of subhousing 21, i.e., parts 22 to 28 and 50 to 70 may be of a single molded piece of non-electrically conductive material, such as plastic. Also, any suitable arrangements of parts may be provided for the subhousing so that board 49 is electrically insulated from housing 11 and the holes 61 to 64 and compartments 52 to 55 arranged as shown for reasons to be discussed.

Thus, again as particularly contemplated in the invention, a plurality, such as four for each preferred compartment 52 to 55, of elongated planar elements of an electrically conductive material, such as plates 71 through 74, are provided inserted into and through compartments 52 to 55, respectively, resting on top of the bottom wall 70 in each compartment between the respective extension walls, under wall 50 and to a position overlying each hole 61 through 64, such as plate 73 overlying hole 63 in FIG. 2. Each plate 71 to 74 preferably includes a nub 75 on its upper surface at its terminal end underlying circuit board 49 and contacting suitable printed circuitry 175 thereon, as seen in FIG. 2. At their other ends, each plate 71 to 74 has an end of reduced width, such as ends 76 to 79, adapted to receive thereon a conventional push-type connector (not shown) of an electrical conduit thereby completing a circuit between said conduit and its respective plate and to circuit board 49. Suitable lock means, such as washers 80 to 83 and screws 84 to 87, extending through apertures 88 in each plate (See FIG. 2) and into apertures 65 to 68, hold plates 71 to 74 in a fixed predetermined position on subhousing 21.

Again, as particularly contemplated in the present invention, a plurality of voltage protection devices, such as four devices 89 (only one device visible in FIG. 2) for each hole 61 to 64 are provided in each hole 61 to 64. Each device is of a configuration, such as barrel-shaped, to fit into its respective hole 61 to 64, and to be easily removed therefrom when its respective plate 71 to 74 is removed, and, as seen in FIG. 2, have its metallic upper end contact the underside of its respective plate, such as plate 73. Suitable voltage protection devices of the type sold by Joslyn Manufacturing & Supply Co. of Chicago, Ill. under the name JOSLYN 113 8544 2022-13, or suitable equivalents thereof, may be used.

As seen in FIGS. 2 and 3, a plurality of elongated resilient and independent spaced fingers, such as fingers 90 to 93, are provided on main housing 11 extending under each hole 61 to 64. Each finger 90 to 93 terminates in an upwardly extending curved end portion 94 (see particularly FIG. 2) with each device 89 adapted to rest on top of the upper surface of each end portion 94 thereby making contact therewith It is to be understood that fingers 90 to 93 are of an electrically conductive material as is the remainder of housing 11 and preferably integral therewith and may be stamped out of the material comprising the housing 11. Thus, end portions 94, being metal, are at electrical ground.

In operation, device 10 is installed in the system in which it is desired to protect the circuitry. Devices 89 are disposed in their respective receptacles and housing 11 is secured, via apertures 17 to 20, to a suitable mounting surface using screws or the like.

A printed circuit board 49 is disposed in subhousing 21 under flanges 41, 42 and resting on the upper surface of nubs 43, 44, 47, 48, members 45, 46 and boss 40. As seen in FIG. 2, nub 75 on each plate 71 to 74 is adapted to contact suitable printed circuitry on the undersurface of board 49. The position thereof is of course predetermined and related to the distance of the printed circuitry 175 of board 49 from each aperture 88 in each plate. Suitable electrical conductors in the system in which device 10 is mounted are connected, as by push ends thereon, to ends 76 to 79, all as is well known in the electrical art. The electrical hook-up of device 10 is now complete.

Should the electrical system in which device 10 is installed encounter excessively high static voltage, such as in an electric storm, such excessive voltage would normally be transmitted, via the conductors coupled to ends 76 to 79, to the device 10 and destory circuit board 49. Of course, not all of the ends 76 to 79 need be connected and thus only a device 89 for each conductor must be provided.

However, as heretofore discussed, and in accordance with the present invention, such high voltage is diverted to the devices 89 by their contact with plates 71 to 74 at the top and with end portions 94 of fingers 90 to 93 at the bottom. The devices 89 thus short out and suppress the excessive high static voltage before such voltage is delivered to board 49.

The voltage characteristics of the devices 89 is selected depending upon the static voltage to be encountered. Although device 10 can be used in any suitable electrical system, it is particularly useful in electrical systems that are exposed to the elements, such as in irrigation control systems.

There is thus disclosed a unique and novel electrical device for protecting electric circuits from excessively high static voltages encountered by the circuits in an electrical system and providing the shortest and most direct path to a ground plane.

I claim:

1. A circuitry protection device for use in an electrical system comprising:
   a main housing of an electrically conductive material;
   a subhousing of a non-electrically conductive material mounted to the main housing;
   circuit board retention means on said subhousing mounting a circuit board thereon in an electrically isolated position on said subhousing with respect to said main housing;
   a plurality of spaced holes in said subhousing open at the top and bottom thereof;
   a plurality of plate members of an electrically conductive material extending from a point outside of said subhousing to a position overlying respective ones of said plurality of spaced holes and having circuit board contacting means on the upper surface thereof contacting the undersurface of the circuit board mounted in said subhousing; and
   a plurality of voltage protection devices mounted in said holes contacting a plurality of members of an electrically conductive material on said main housing, said members underlying the open bottom of each of said spaced holes and contacting said devices disposed in said holes.

2. The device of claim 1 wherein said circuit board retention means includes said subhousing having spaced side members interconnected by spaced end members, a plurality of spaced nubs (43, 44, 47 and 48) and abutment members (45, 46) on the inner surfaces of said side and end members terminating at a point below the upper surfaces of said side and end members, and at least a pair of flanges at each corner of one end of said subhousing where said side members intersect with one of said end members on the upper surfaces thereof whereby said circuit board is disposed under said flanges and on top of said abutment members and nubs and between said side and end members.

3. The device of claim 1 wherein said subhousing includes a pair of spaced side members interconnected by end members and each of said holes is an opening through a support member opening between said spaced side members.

4. The device of claim 3 wherein said subhousing includes a plurality of spaced compartments spaced from said holes and separated therefrom by a frontal wall, said frontal wall having an opening at the bottom thereof communicating each of said holes with said compartments, said plate members extending through each of said compartments to its respective hole through the respective opening in said frontal wall and a plurality of spaced wall extensions separating each of said compartments from the next adjacent compartment.

5. The device of claim 1 wherein each of said members includes an elongated resilient independent member integral at one end with said main housing and at the other end extending a short distance up and into said open bottom of each of said holes.

6. The device of claim 1 wherein said subhousing is a unitary piece of molded plastic snap fit onto said main housing, said main housing being a unitary piece of metallic material.

7. The device of claim 6 wherein said circuit board retention means and said space compartments are part of the unitary piece of molded plastic of said subhousing.

8. The device of claim 6 wherein said voltage protection device contacting members are integral parts of the unitary piece of metallic material of said main housing.

9. A circuitry protection device for use in an electrical system comprising:
   a main housing of an electrically conductive material;
   a subhousing of a nonelectrically conductive material mounted to the main housing;
   a printed circuit board mounted on said subhousing in an electrically isolated position on said subhousing with respect to said main housing;
   a plurality of spaced holes in said subhousing open at the top and bottom thereof;
   a plurality of voltage protection devices loosely disposed in each of said holes;
   a plurality of plate members of an electrically conductive material extending from a point outside of said subhousing to a position overlying respective ones of said plurality of spaced holes and said voltage protection devices disposed therein, and said plate members having a portion thereon contacting the underside of said printed circuit board; and
   a plurality of voltage protection device contacting members of an electrically conductive material on said main housing underlying the open bottom of each of said spaced holes and contacting the bottom of said voltage protection devices disposed in said holes.

10. A circuitry protection device comprising:
    a main housing of unitary piece of metallic material having an upper planar top member, at least a pair of spaced downwardly extending side members and at least a pair of base support members connected to said side members lying in a horizontal plane generally parallel to the plane of said top member;
    a plurality of spaced elongated resilient independent strips stamped out of the material comprising said top member having upturned ends thereon; and
    a subhousing of a unitary piece of molded plastic material snap fit to the top member of said main housing, said subhousing being generally rectangular having spaced upstanding side members interconnected by end members and a planar support member extending between said side members below the upper surfaces of said side members but spaced from said top member of said main housing, said subhousing having a plurality of spaced linearly aligned holes through said planar support member open at the top and bottom ends thereof, the upturned ends of said elongated strips extending upwardly a short distance into the open bottom end of each of said holes, said subhousing also having a frontal wall extending between the side member separating the holes from a plurality of spaced compartments, each of said compartments being linearly aligned with a respective one of each of said holes with wall extensions separating one of said compartments from the next adjacent compartment and an opening at the bottom of said frontal wall adjacent each of said compartments.

11. The device of claim 10 including a plurality of elongated plates mounted in each of each compartments extending from a point exteriorly of said subhousing, through each of said compartments, through its respective opening in said frontal wall to a point overlying the open end of each respective hole.

12. The device of claim 11, including a voltage protection device mounted in each of said holes, each voltage protection device having an upper surface contacting the underside of a respective said plate overlying a respective said open end of the hole in which said voltage protection device is disposed and having a lower surface contacting the upper surface of the respective upturned end extending therein.

* * * * *